(12) United States Patent
Singleton et al.

(10) Patent No.: US 7,667,333 B2
(45) Date of Patent: Feb. 23, 2010

(54) STACK OF SEMICONDUCTOR CHIPS

(75) Inventors: Laurence Edward Singleton, Dresden (DE); Alexander Wollanke, Dresden (DE); Jesus Mennen Belonio, Dresden (DE)

(73) Assignee: Infineon Technologies AG, Munich (DE)

( * ) Notice: Subject to any disclaimer, the term of this patent is extended or adjusted under 35 U.S.C. 154(b) by 462 days.

(21) Appl. No.: 11/341,884

(22) Filed: Jan. 27, 2006

(65) Prior Publication Data

US 2007/0176275 A1    Aug. 2, 2007

(51) Int. Cl.
*H01L 23/02* (2006.01)

(52) U.S. Cl. ............... 257/777; 257/686; 257/E23.116

(58) Field of Classification Search ............ 257/777, 257/686, E23
See application file for complete search history.

(56) References Cited

U.S. PATENT DOCUMENTS 6,351,028 B1 * 2/2002 Akram ............. 257/686
2002/0121706 A1 * 9/2002 Tatsuta et al. ............ 257/778
2003/0015803 A1   1/2003 Prietzsch
2004/0126910 A1   7/2004 Thomas et al.
2005/0012196 A1   1/2005 Akram
2006/0289970 A1 * 12/2006 Gogl et al. ............ 257/659

* cited by examiner

*Primary Examiner*—Leonardo Andújar
(74) *Attorney, Agent, or Firm*—Slater & Matsil, L.L.P.

(57) ABSTRACT

A stack of semiconductor chips includes a substrate or an interposer board comprising conductor structures for electrical connection of the stack and a first chip. The first chip includes an active side with peripherally arranged bonding pads and is mounted face-up on the substrate or the interposer board. The stack beyond includes at least a further chip with peripherally arranged bonding pads on its active side. The back side and at least two chip edges of the further chip are embedded by a mold cap providing a protuberance on the back side of the chip. The protuberance forms a planar surface extending substantially parallel and with a distance to the back side of the chip. The further chip is attached face-up to the active side of the first chip by an adhesive applied between the protuberance and the first chip so that the protuberance is inserted between both chips to provide a gap there. The protuberance has at least one linear dimension that is smaller than a linear dimension of the subjacent chip.

15 Claims, 4 Drawing Sheets

STACK OF SEMICONDUCTOR CHIPS

TECHNICAL FIELD

The invention is concerned with stacked semiconductor chips comprising integrated circuits like memory devices or controllers or the like and peripherally arranged bonding pads which are directly stacked on a carrier substrate or an interposer board. The stacked chips are electrically contacted to conductor structures of the substrate or the board by bond wires.

BACKGROUND

The development of the application of integrated circuits shows that more complex functions are realized by stacking two or more chips. Several technologies for stacking the chips and for their contacting are known. A generally known embodiment for increasing the packaging density is to stack unpackaged components using an adhesive medium for stacking the chips on top of each other, with connections from each chip to the substrate or to another chip via wire bonds.

U.S. Patent Application Publication 2003/0015803 discloses a multichip module with two or more stacked bare chips. Here, the first chip is mounted directly on a substrate and a further chip is spaced apart by a spacer of smaller dimensions attached to adjacent chips by an adhesive. The spacer prevents the chips from directly contacting each other and it allows wire-bonding of each of the stacked chips to a substrate, by using the unused space beside the spacer and between the adjacent chips. To prevent damage to the bond wires, the spacer is shorter on the sides facing the bonding pads of the chips and the height of the spacer is determined by the desired wire bond connections and the used bonding tool.

The spacer must include design considerations for wire bonding, and position between the chips requires a certain account of the bond wires and a certain design and positioning. This consideration is relevant for both the upper and bottom chips, with respect to the spacer and with respect to the adhesive on both sides of the spacer. Since a correction of the position of the chip is not possible, misplacement will cause problems in wire bonding and in the reliability requirements. Moreover, the optimum dispensing of the adhesive between spacer and chip is not a simple process. Consequently, the assembly process is very time consuming, i.e., long processing time and the extension of this basic technology to a stack with more than two chips increases the complexity and increases its costs. In addition, if the chips get thinner or if a redistribution layer (RDL) is required, the assembly process and handling becomes more difficult.

Additionally, one disadvantage of the stacking of so-called bare chips, is that cracks or other mechanical damage can arise, in the course of handling, which may also have effects on the active chip side and consequently in the reliability of the stack.

U.S. Patent Application Publication No. 2005/0012196 also discloses a multichip device in a stacked configuration that uses a spacing element for allowing increased device density. The spacing element is an interposer device having a T-shape in cross-section. The base of the vertical stem of the T-interposer is attached to a substrate or the active side of a chip and its T-bar member extending across the stem, forms a horizontal surface for stacking of a further chip.

This configuration utilizes two adhesive areas, between the T-interposer and the substrate or the bottom chip, as well as between the T-interposer and the upper chip. Moreover, the configuration also uses unpacked chips with the above-explained disadvantages.

In U.S. Patent Application Publication No. 2004/0126910 the central bond pads on the side of memory chips and their wire bond connections, are covered by a protective encapsulation. The encapsulation has a flat upper surface and is higher than the loops of the covered wire bond connections. This permits stacking of the chips with vertical spacing. However, the encapsulation attached on the active side avoids one of the adhesive areas, but it is inapplicable to every chip.

SUMMARY OF THE INVENTION

The preferred embodiment of the present invention is therefore based on the problem of presenting a stackable semiconductor chip that simplifies the stacking process with high packaging density and overcomes the disadvantages of the prior art. In another aspect, the invention may be integrated cost-optimally into existing production and testing technology.

According to one aspect of the invention, a stack of semiconductor chips includes a substrate or an interposer board comprising of conductor structures for electrical connection of the stack and a first chip. The first chip includes an active side with peripherally arranged bonding pads and is mounted face-up on the substrate or the interposer board. The stack beyond includes at least a further chip with peripherally arranged bonding pads on its active side. The back side and at least two chip edges of the further chip are embedded by a mold cap providing a protuberance on the back side of the chip. The protuberance forms a first surface extending substantially parallel and with a distance to the back side of the chip. The further chip is attached face-up to the active side of the first or a further chip by an adhesive applied between the protuberance and the first chip so that the protuberance is inserted between both chips to provide a gap there. The protuberance has at least one linear dimension that is smaller than a linear dimension of the subjacent chip.

According to embodiments of the invention, the back side of the chip stacked on the active side of a subjacent chip, is at least partially embedded in a mold cap before stacking. The mold cap is formed on the back side of the chip so that it provides the required distance between the adjacent, face-up stacked chips. Therefore, the protuberance is no additional component, so that the mold cap reduces the number of process steps for the assembly of the second and for each further chip. The mold cap with the protuberance and the chip, constitutes one component and only one layer of adhesive is required for adhering a chip on top of another chip, for instance, an adhesive tape or a printed thin layer of adhesive material. Alternatively, a self-adhesive material that takes over the fixation of the chips can be used for the encapsulation.

Alongside the reinforcing of the chips and thus the improvement of the handling of particularly thin chips, the mold cap on the back side of the chip offers advantages in reducing the warpage of thin chips, especially, such chips with a redistribution layer.

With "bond pads" shall be named in the following the pads of the chip serving for its electrical connection to the substrate, to the board or to another chip. It also includes displacing of central-row or multi-row conductor pads via suitable line conductor structures on the surface of the chip to the peripherally arranged bonding pads of the chip.

Another advantage of the invention is the applicability of standard methods and thus standard equipment for making the several components and for the assembly of the stack especially when the mold cap consists of a mold compound.

A special refinement of the invention is characterized, in that the first chip comprises a mold cap too. In the above described manner, the first chip is mounted with the planar surface of the protuberance on the substrate or the interposer board by an adhesive applied between the protuberance and the substrate or the interposer board. In this case, all chips can be produced and stacked in the same manner, especially when all mold caps of the stacked chips are formed similar to each other.

In a variant of the invention, the protuberance consists of two portions forming a further substantially planar surface in a laterally displaced and substantially one-level relationship to the first surface. Since stacking of the individual components is done by fastening the planar surface of the protuberance to the active side of the subjacent chip, it is necessary that both surfaces are substantially in-plane. Resulting from the distance between the first and the second surface, the protuberance includes a gash between its portions so that, in case of an encapsulation of the stack, the encapsulation material is also employed to improve adhesion between chips. The adhesion is increased by increasing the surface area accessible to encapsulant material, which is a result of the design of the protuberance.

Moreover and independent of the design of the protuberance, a mismatch of the coefficient of thermal expansion (CTE) is reduced, because the mold material is between the stacked chips and around the stacked chips. Since there is no additional spacer or adhesive tape, the only CTE mismatch is between mold compound and silicon chip, which simplifies the package considerably, and permits optimization of mold compound to yield CTE matched materials. It is claimed a protuberance with two portions, but is also possible to split up the protuberance in more than two portions. In this case, all the surfaces of all several portions of the protuberance are in-plane with respect to each other and consequently with respect to the active side of the subjacent chip.

In another embodiment of the invention, the protuberance and the subjacent chip provide positioning marks being compatible to one another. For example, special indentations permit predefining of the position of the further chip with respect to the subjacent chip and thus increasing in process reproducibility and assembly reliability. For example, indentations on the protuberance also permit one chip to be offset from the other.

According to another aspect of the invention, the stack further comprises electrical connection of the bonding pads to the conductor structures of the substrate or the interposer board and uniting encapsulation of stacked semiconductor chips with mold compound, such as silicon or epoxy. The mold compound flows between the stacked chips to further improve their adhesion. Additionally, the mold cap and mold compound have comparable materials and consequently comparable CTE's what reduces the loss rate of the assembled arrangements.

Further particularly effective embodiments are represented by above described configurations of the inventions that are characterized, in that the several chips have been placed and fastened face-down on a substrate or an interposer board and on one another. The face-down assembling of the bottom component, permits its electrical connection to the carrier substrate by direct soldering, particularly by solder bumps, thus utilizing the advantages of the SMT- or flip-chip bonding process, in particular the parallel production of all contacts.

For an assembly of face-down stacked chips, unlike the face-up stacking, the first chip requires the protuberance for attaching the next chip on the planar surface. The top chip of the stack does not require a protuberance, anyhow a similar embedding of all stacked chips simplifies the technology.

BRIEF DESCRIPTION OF THE DRAWINGS

For a more complete understanding of the present invention, and the advantages thereof, reference is now made to the following descriptions taken in conjunction with the accompanying drawings, in which:

FIG. 4b shows a cross-sectional view taken along line 4A-4A of FIG. 4a;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
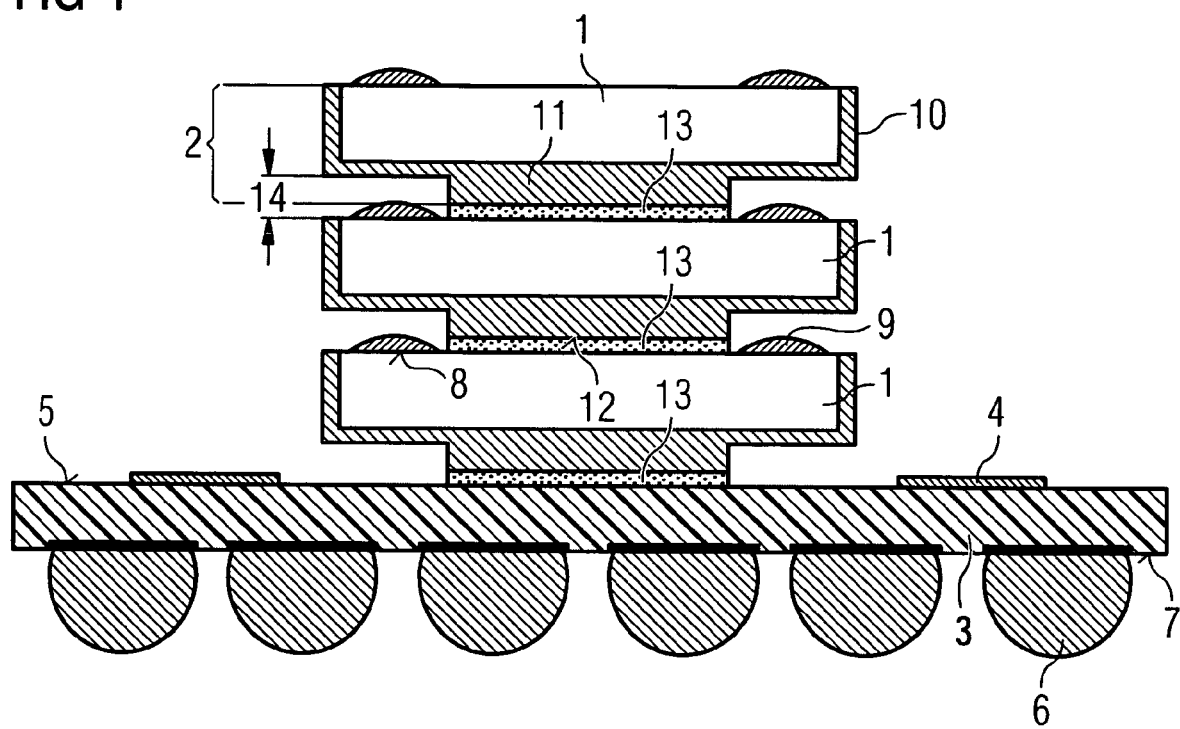
FIG. 1 shows a schematic cross-sectional view of a stack of semiconductor chips.

FIG. 1 shows three individual embedded semiconductor chips 1 (individual components 2) in a face-up arrangement on a carrier substrate 3. Conductor structures 4 of the upper surface 5 of the substrate 3 are electrical interconnected (not shown) with electrical contacts 6 located on the lower surface 7 of the substrate 3. In the preferred embodiments, these contacts 6 are fine pitch ball grid arrays (FBGA), by means of which the stack arrangement can be integrated into a circuit, e.g., by soldering the contacts 6 to a circuit board (not shown).

All individual chips 1 of the stack have on its active side 8 bonding pads 9 arranged in peripheral areas of the chips 1. The bonding pads 9 make for the electrical connection of each individual chip 1 to the conductor structures 4 during subsequent assembling of the package. Each individual chip 1, further has a mold cap 10 embedding the back side of the chip 1 and all chip edges of the flat cuboids of the chip 1 (in the cross sectional view just two chip edges are visible).

Each mold cap 10 comprises a protuberance 11 having a smaller dimension here in direction of the flat of the drawing, than this linear dimension thereof embedded chip 1 and the subjacent chip 1 too. The protuberance 11 is located in the central area of the back side of the chip 1. In the illustrated embodiment of the invention, the individual chips 1 have the same sizes and their mold cap 10, their protuberances 11 and the locations of the protuberances 11 are identical. In other embodiments, the sizes of the chips 1 can be different. In either case, the dimensions of each protuberance 11 is so defined that it only spans an area located between the bond pads 4 of the subjacent chip 1.

The protuberance 11 comprises a substantially planar surface 12 extending substantially parallel and with a distance to the back side of the chip 1. The planar surface 12 is provided for attaching the individual component 2 on the substrate 3 and on one another.

In the illustrated embodiment, each of the components 2 includes a chip 1 embedded in a mold cap 10 that includes a protuberance 11. Having each of the components 2 be identical in configuration, simplifies inventory control in a manufacturing environment. In another embodiment, however, it is possible that ones, e.g., the chip mounted closest to the board, not include a mold cap with a protuberance 11. This variation will make the total dimension of the stack thinner.

Manufacturing of individual embedded chips 1 may be use known suitable technologies, for example, the fan-out technology. A variation on a possible process for embedding the chip 1 follows. Front-end tested chips 1 are temporarily affixed in a regular array faced down on an appropriate tape or a carrier plate. The individual chips 1 are placed with a distance to each other that defined the distance for using dicing plus the double appropriate thickness of the mold material adjacent to the chip edge. Molding compound is transferred by the usual molding techniques to the area between the chips 1 and behind the chips 1. The protuberances 11, on the back side of each chip 1, are formed by corresponding cavities in a molding tool, in which the mold compound flows in the course of the molding process. If necessary, the substantially planar and parallel surface 12 and the appropriate thickness of the protuberance 11 can be defined using grinding. Afterwards, the individual components 2 are separated by dicing.

A first of the embedded chips 1 is picked, face-up placed and attached with the planar surface 12 of its protuberance 11 to the upper surface 5 of the substrate 3 by suitable adhesive 13. A further individual component 2 is picked, face-up placed congruently with the first chip 1 and attached with the planar surface 12 of its protuberance 11 to the active side 8 of the first chip 1. In this manner, further individual components 2 may be stacked on top of each other.

Gaps 14 are provided between the mold cap 10 and the active side 8 of two adjacent chips 1 in their peripheral areas beside of each protuberance 11. The height and the width of each gap 14 are defined by the thickness and the smaller dimension of the protuberances 11 compared to the dimension of the subjacent component 2.

Figure 2:
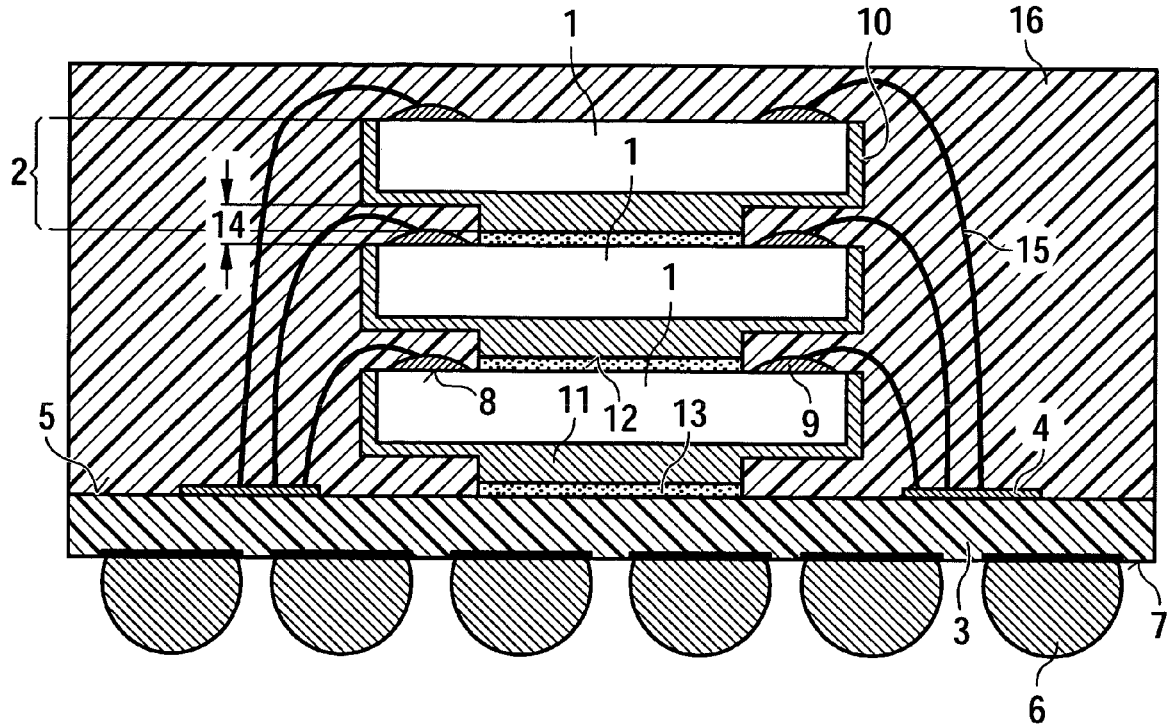
FIG. 2 shows a cross-sectional view of an encapsulated assembly of face-up stacked semiconductor chips.

In the assembly, shown in FIG. 2, the peripherally arranged bonding pads 9 of three stacked components 2, are wire bonded to the conductor structures 4 of the substrate 3. For electrical connecting, the wires 15 are bonded on the bonding pads 9 before stacking and free edges of the wires 15 are separately bonded to the corresponding contact pads of the conductor structures 4. As shown in the drawing, each gap 14 located between the mold cap 10 and the subjacent component 2 is preferably higher than the wire bridges. The stack arrangement is then surrounded by mold compound 16 to yield the final package. The mold compound 16 fills in the gap 14 increasing the adhesion of stacked components 2 and covering the arrangement.

The bonding pads 9 can be bond pads formed from the metallization of the back end of line process. Alternatively, the bond pads 9 can be part of a redistribution layer, for example, that redistributes center bond pads. Another configuration for such another bonded chip is shown in FIG. 3.

Figure 3:
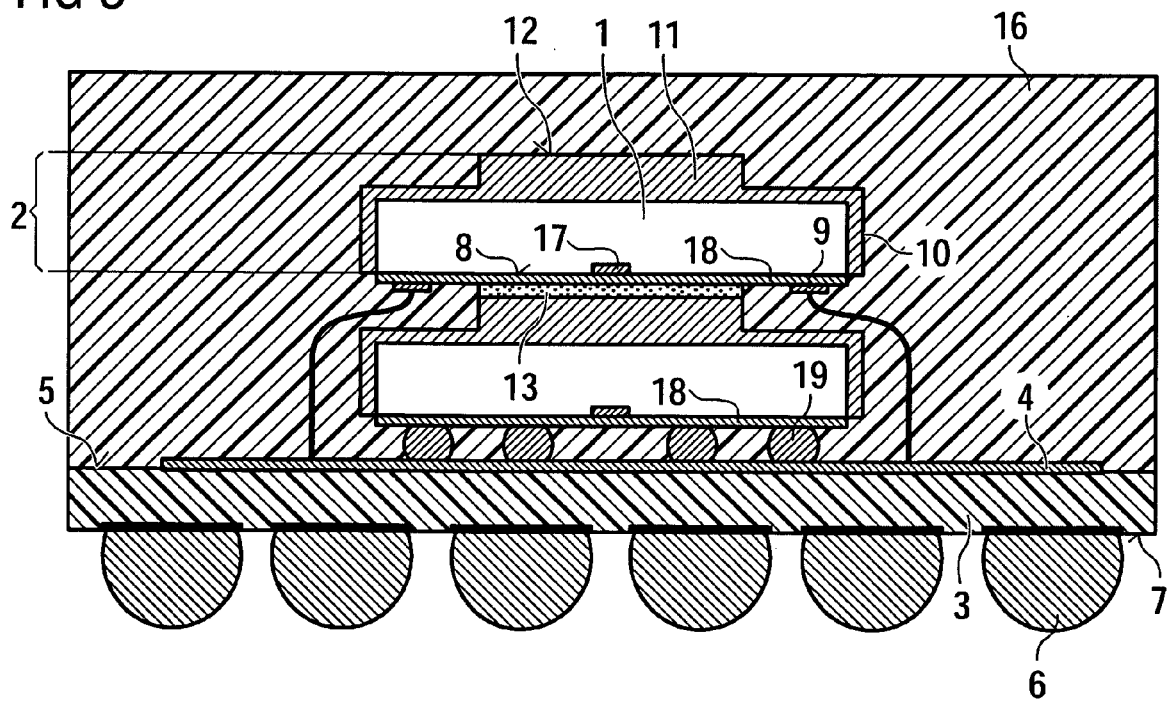
FIG. 3 shows a cross-sectional view of an encapsulated assembly of face-down stacked semiconductor chips.

FIG. 3 shows two discrete components 2 in a face-down arrangement on a carrier substrate 2 comprising conductor structures 4 on its upper surface 5 interconnected with electrical contacts 6 of FBGA on its lower surface 7. Each chip 1 includes central-row conductor pads 17 and a reroute layer 18 consisting of (not shown) a metallic coating and a interposer and interconnecting the conductor pads 17 with the peripherally arranged bonding pads 9 on the active side 8 of the upper chip 1 and the solder balls 19 on the active side 8 of the lower chip, respectively.

The lower component, which is the first embedded chip 1 of the stack including mold cap 10 with a protuberance 11, is face-down attached to the substrate 3 and electrically connected to its conductor structures 4 by means of the solder balls 19. The upper embedded chip 1, including a protuberance 11 too, is attached to the planar surface 12 of the protuberance 11 of the first component 2 by suitable adhesive 13, so that the bonding pads 9 of the upper chip 1 are located in the gap 14 provided by the protuberance 11 of the first component 2.

The bonding pads 9 of the upper component 2 of the stack are wire bonded to the conductor structures 4 of the substrate 3. The stack arrangement is then surrounded by mold compound 16 to yield the final package. The mold compound 16 fills in the gap 14 increasing the adhesion of stacked components 2 and covering the arrangement.

Figure 4A:
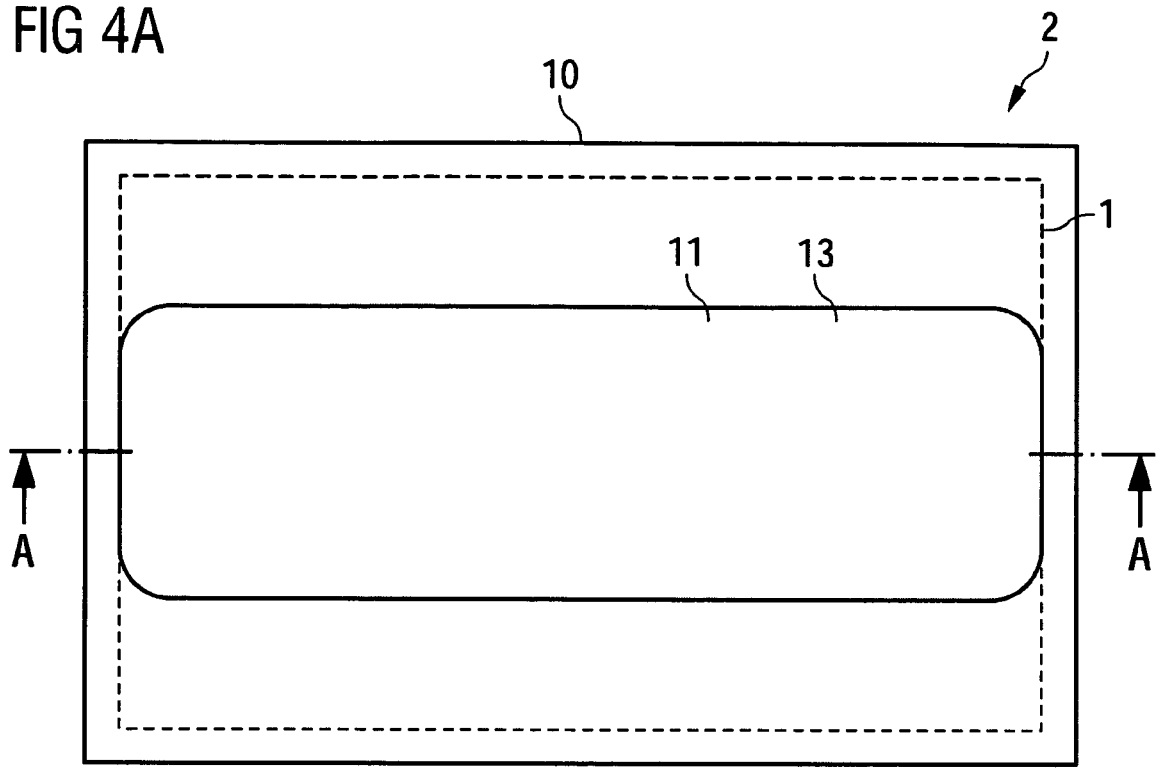
FIG. 4a shows a plan view of an embedded chip of the present invention.
Figure 4B:
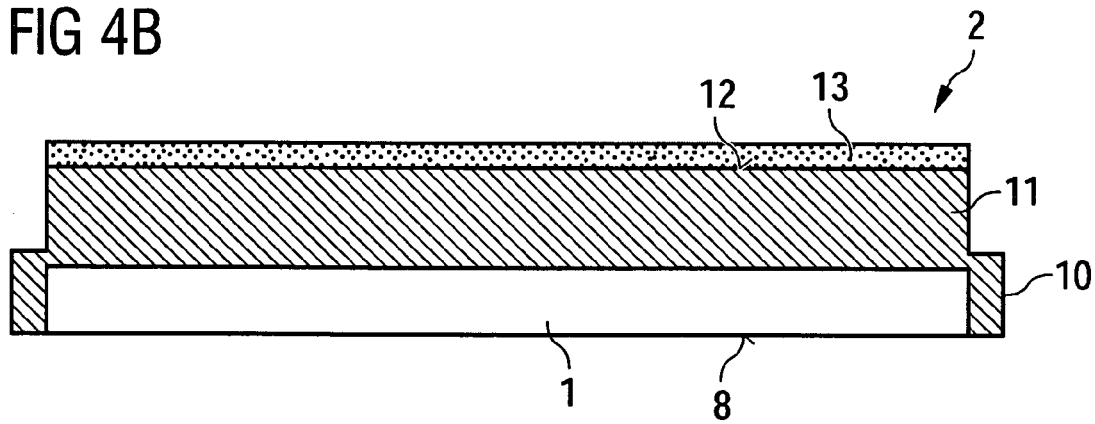

FIG. 4a and FIG. 4b illustrate an exemplary embodiment of an individual component 2. The component 2 includes of the semiconductor chip 1 whose edge and back side are enclosed by mold material 10. The thickness of mold material 10 depends on different factors and can vary between the material at edges and the material on backside of the chip beside the protuberance. For example, the thickness of the mold material 10 depends on size and thickness of the chip and on existence of RDL. For example, the mold cap on backside of a chip without redistribution layer (RDL) may be about 50 to 100 μm thick. To reduce warpage of the embedded chip with RDL the mold cap on backside of any such chip may be thicker than about 100 μm. The thickness of this portion of mold cap of a thin chip may be approximately 100 μm. Depending on application of the chip and on needs space for wire bond, the protuberance may be about 50 to 300 μm thick. At the edges of the chip, it is better to keep the thickness as thin as possible to prevent difficulties with wire bonding. For example, the mold cap may be preferably about 50 to 100 μm. These values are obviously best estimates and would have to be checked in a production environment. The trend is based, however, on real technical issues.

In all shown embodiments, the thickness of enclosing mold material 10 is homogeneous protuberance 11 excepted. The rectangular protuberance 11 comprising rounded corners, is in one dimension being at right angles with the line A-A smaller than same dimension of the chip 1. The other dimensions of the protuberance 11 and the chip 1 are equivalent. The protuberance 11 comprises a planar surface 12 extending substantially parallel and with a distance to the back side of the chip 1. On the planar surface 12 an adhesive layer 13 is holohedral applied.

Figure 5A:
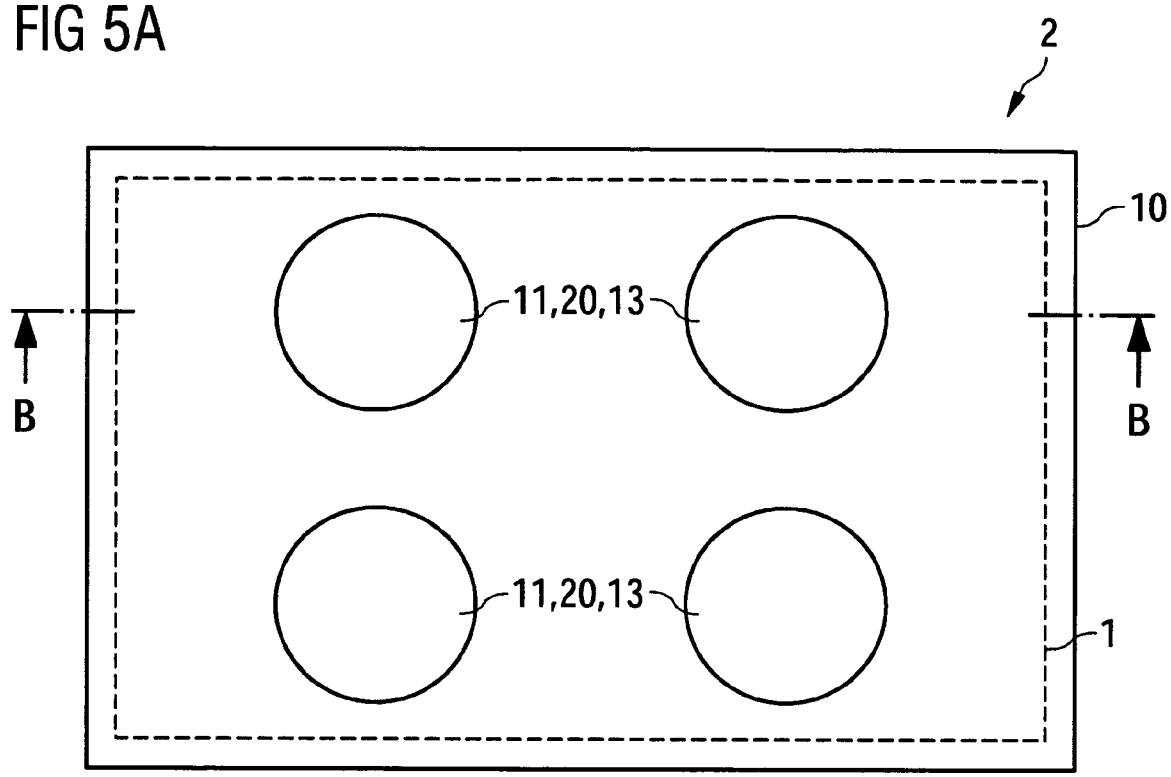
FIG. 5a shows a plan view of another embedded chip of the present invention.
Figure 5B:
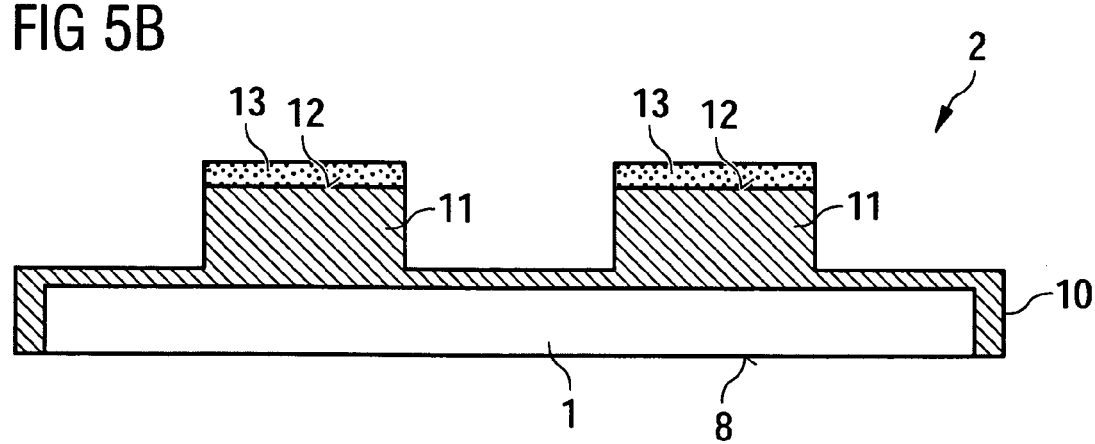
FIG. 5b shows a cross-sectional view taken along line 5B-5B of FIG. 5b.

A further variation of an individual component 2 is shown in FIG. 5a and FIG. 5b and comprises a mold cap 10 including a protuberance 11 consisting of four equal portions 20. Each portion 20 is cylindrically formed and is located on a quarter of the back side of the chip 1. The four portions have a uniform height so that their planar surfaces 12 turned away from the chip 1 are located on the same level. On the discrete portions of the planar surface 12 an adhesive layer 13 is holohedral applied.

While this example provides four separate protuberances 11, it is understood that any number, e.g., 2 or 16, can be used. The separate protuberances can have equivalent planar cross-sections as shown in FIG. 5A or can have different cross-sectional shapes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A stack of semiconductor chips comprising:
a substrate or an interposer board comprising conductor structures for electrical connection of the stack,
a first chip including an active side with peripherally arranged bonding pads mounted face-up on the substrate or the interposer board;
a further chip including a further active side with peripherally arranged bonding pads; and
a mold cap embedding a back side and at least two chip edges of the further chip and including a protuberance at the back side of the further chip, the protuberance forming a substantially planar first surface extending substantially parallel to and a distance from the back side of the further chip,
wherein the further chip is attached face-up to the active side of the first by an adhesive applied between the protuberance and the first chip so that the protuberance is inserted between the first chip and the further chip thereby providing a gap therebetween, the protuberance having at least one linear dimension that is smaller than a linear dimension of the first chip.

2. The stack of semiconductor chips according to claim 1, wherein the mold cap comprises mold compound.

3. The stack of semiconductor chips according to claim 1, further comprising a second mold cap embedding a back side and at least two chip edges of the first chip, the first chip being mounted on the substrate or the interposer board by an adhesive applied between a protuberance of the second mold cap and the substrate or the interposer board.

4. The stack of semiconductor chips according to claim 3, wherein the mold cap and the second mold cap have substantially the same dimensions.

5. The stack of semiconductor chips according to claim 1, wherein the protuberance includes at least two laterally spaced portions that have substantially co-planar surfaces.

6. The stack of semiconductor chips according to claim 1, further comprising electrical connection between the bonding pads of the first chip and the further chip and the conductor structures.

7. The stack of semiconductor chips according to claim 6, wherein the first chip, the further chip and the electrical connection are encapsulated with a mold compound.

8. The stack of semiconductor chips according to claim 1, further comprising:
a second further chip including an active side with peripherally arranged bonding pads; and
a second mold cap embedding a back side and at least two chip edges of the second further chip and including a protuberance at the back side of the second further chip, the protuberance forming a substantially planar first surface extending substantially parallel to and a distance from the back side of the second further chip;
wherein the second further chip is attached face-up to the active side of the further chip by an adhesive applied between the protuberance and the further chip.

9. A stack of semiconductor chips comprising:
a substrate or an interposer board comprising conductor structures for electrical connection of the stack,
a first chip including an active side with peripherally arranged bonding pads mounted face-up on the substrate or the interposer board;
a further chip including a further active side with peripherally arranged bonding pads; and
a mold cap embedding a back side and at least two chip edges of the further chip and including a protuberance at the back side of the further chip, the protuberance forming a substantially planar first surface extending substantially parallel to and a distance from the back side of the further chip,
wherein the further chip is attached face-up to the active side of the first by an adhesive applied between the protuberance and the first chip so that the protuberance is inserted between the first chip and the further chip thereby providing a gap therebetween, the protuberance having at least one linear dimension that is smaller than a linear dimension of the first chip, and wherein the protuberance and the first chip provide positioning marks that are compatible to one another.

10. The stack of semiconductor chips according to claim 9, wherein the mold cap comprises mold compound.

11. The stack of semiconductor chips according to claim 9, further comprising a second mold cap embedding a back side and at least two chip edges of the first chip, the first chip being mounted on the substrate or the interposer board by an adhesive applied between a protuberance of the second mold cap and the substrate or the interposer board.

12. The stack of semiconductor chips according to claim 9, wherein the protuberance includes at least two laterally spaced portions that have substantially co-planar surfaces.

13. The stack of semiconductor chips according to claim 9, further comprising electrical connection between the bonding pads of the first chip and the further chip and the conductor structures.

14. The stack of semiconductor chips according to claim 13, wherein the first chip, the further chip and the electrical connection are encapsulated with a mold compound.

15. A stack of semiconductor chips comprising:
a substrate or an interposer board comprising conductor structures for electrical connection of the stack,
a first chip including an active side with peripherally arranged bonding pads mounted face-up on the substrate or the interposer board;
a further chip including a further active side with peripherally arranged bonding pads; and
a mold cap embedding a back side and at least two chip edges of the further chip and including a protuberance at the back side of the further chip, the protuberance forming a substantially planar first surface extending substantially parallel to and a distance from the back side of the further chip, the mold cap comprising a mold compound,
wherein the further chip is attached face-up to the active side of the first by an adhesive applied between the protuberance and the first chip so that the protuberance is inserted between the first chip and the further chip thereby providing a gap therebetween, the protuberance having at least one linear dimension that is smaller than a linear dimension of the first chip; and
a further mold compound surrounding the stack of semiconductor chips.

* * * * *